United States Patent [19]
Ohara

[11] Patent Number: 5,864,661
[45] Date of Patent: Jan. 26, 1999

[54] IC MEMORY CARD HAVING FLASH MEMORY

[75] Inventor: Minoru Ohara, Tokyo, Japan

[73] Assignee: Kabushiki Kaisha Toshiba, Kawasaki, Japan

[21] Appl. No.: 713,367

[22] Filed: Sep. 13, 1996

Related U.S. Application Data

[63] Continuation of Ser. No. 437,229, May 8, 1995, abandoned.

[30] Foreign Application Priority Data

May 10, 1994 [JP] Japan ................................. 6-096666

[51] Int. Cl.⁶ .............................. G06F 11/00; G06F 12/00
[52] U.S. Cl. ................................ 395/183.18; 395/182.03; 395/182.06; 371/10.2
[58] Field of Search ........................ 395/183.18, 182.06, 395/182.03, 182.04, 183.01, 183.06, 281, 282; 371/2.2, 10.2, 21.6, 40.1; 364/245.3; 711/152, 156, 165, 173

[56] References Cited

U.S. PATENT DOCUMENTS

| | | | |
|---|---|---|---|
| 3,234,521 | 2/1966 | Weisbecker | 395/182.06 |
| 3,633,175 | 1/1972 | Harper | 340/172.5 |
| 4,380,066 | 4/1983 | Spencer et al. | 395/182.04 |
| 4,479,214 | 10/1984 | Ryan | 395/183.18 X |
| 4,654,847 | 3/1987 | Dutton | 371/10 |
| 4,748,320 | 5/1988 | Yorimoto et al. | 235/492 |
| 5,200,959 | 4/1993 | Gross et al. | 371/21.6 |
| 5,295,255 | 3/1994 | Malecek et al. | 711/1 |
| 5,311,462 | 5/1994 | Wells | 365/49 |
| 5,390,148 | 2/1995 | Saito | 365/189.01 |
| 5,402,385 | 3/1995 | Ozeki | 365/230.01 |
| 5,418,752 | 5/1995 | Harari | 365/218 |
| 5,483,491 | 1/1996 | Yoshioka et al. | 365/200 |
| 5,524,231 | 6/1996 | Brown | 395/428 |
| 5,530,673 | 6/1996 | Tobita et al. | 365/185.09 |
| 5,671,229 | 9/1997 | Harari et al. | 371/10.2 |
| 5,740,349 | 4/1998 | Hasbun et al. | 395/182.06 |

FOREIGN PATENT DOCUMENTS

| 1179300 | 7/1989 | Japan | G11C 29/00 |
|---|---|---|---|

*Primary Examiner*—Dieu-Minh Le
*Attorney, Agent, or Firm*—Finnegan, Henderson, Farabow, Garrett & Dunner, L.L.P.

[57] ABSTRACT

A memory card comprises a flash memory for storing data, in which defective block data indicating defective one of memory blocks constituting the flash memory is stored in advance, and an attribute memory for storing attribute data of the memory card, wherein the defective block data is stored in a blank area of the attribute memory so as to assure that the defective block data is regenerated in the flash memory in a case where the defective block data on the flash memory is erased.

11 Claims, 5 Drawing Sheets

| BLOCK 1 | BLOCK 2 | BLOCK 3 | BLOCK 4 | BLOCK 5 | |
|---------|---------|---------|---------|---------|--|
| 111111  | 000000  | 111111  | 000000  | 111111  | ----- |
| 111111  | 000000  | 111111  | 000000  | 111111  | |

F I G. 1A (PRIOR ART)

| BLOCK 1 | BLOCK 2 | BLOCK 3 | BLOCK 4 | BLOCK 5 | |
|---------|---------|---------|---------|---------|--|
| 111011  | 010011  | 111111  | 111111  | 100011  | ----- |
| 100111  | 001110  | 111111  | 111111  | 111111  | |

| BLOCK 1 | BLOCK 2 | BLOCK 3 | BLOCK 4 | BLOCK 5 | |
|---|---|---|---|---|---|
| 111111 | 000000 | 111111 | 000000 | 111111 | ----- |
| 111111 | 000000 | 111111 | 000000 | 111111 | |

DEFECTIVE BLOCK TABLE

| DEFECTIVE BLOCK TABLE ENTRY | DEFECTIVE BLOCK ADDRESS |
|---|---|
| 0 | 0002h |
| 1 | 0100h |
| 2 | 01F5h |
| 3 | 01FFh |
| ⋮ | — |
| 511 | — |

F I G. 6

F I G. 7

F I G. 8

IC MEMORY CARD HAVING FLASH MEMORY

This is a continuation of application Ser. No. 08/437,229, filed May 8, 1995, abandoned.

BACKGROUND OF THE INVENTION

1. Field of the Invention

The present invention relates to an IC memory card having a flash memory and an attribute memory, which is used as a memory medium such as a data processing device.

2. Description of the Related Art

Conventionally, hard disk devices or floppy disk devices are widely used as an external memory device of a data processing device such as a personal computer or work station. Recently, IC memory cards (integrated circuit memory cards) are being used as an external memory device in place of those disk devices, and accordingly, personal computers have as a standard device slots for holding memory cards, or periphery devices such as memory card reader or writer to which can be optionally supplied with personal computers, are being developed.

A memory card is advantageous in terms of portability, and it has a larger storing capacity than that of a floppy disk. Thus, a memory card is convenient when transferring between terminals or carrying from one place to another.

Although the memory card is convenient as described above, its specification varies widely from one production maker to another, and the memory card entails the problem of being incompatible with a lot of different computer models in comparison with the floppy disk, for example. Due to these circumstances, the standardization of the memory is in progress, and more recently, a memory card having a specification in conformity with the standard set by PCMCIA (personal computer memory card international association) has been developed. A memory card having, for example, a flash EEPROM (flash electrically erasable programmable read-only memory) is standardized in terms of its physical and electrical specifications.

However, in accordance with an increase in the degree of integration and the capacity of the flash EEPROM, it is getting difficult to form a defective free bit (memory area) or block (a set of the predetermined number of bits) in the chip. As a result, flash EEPROMS, shipped from the factory, inevitably contain defective bits or defective blocks.

When manufacturing flash EEPROMs, the test for checking erasing and writing is usually carried out chip by chip. When it is judged that a chip contains a defective block, data "0" is marked on all the bits in the defective block. In the case where there is even only one defective bit present in a block, the block is still handled as a defective block. With the marking, initial defect data which indicates a defective block on a flash EEPROM is recorded.

The judgment in the test is made very precisely in consideration of the erase/write properties and the like with regard to the applied voltage value. Even if data can be temporarily erased or written, a block having a low reliability in storing data is judged to be defective.

As described above, the initial defective data recorded on the flash EEPROM in the marking has a very high reliability, and therefore it is desirable that the judgment of a block as to GOOD or NO GOOD should be made based on the initial defect data when the test of the flash EEPROM is carried out.

The flash EEPROM in which the initial defect data is recorded, is built in a memory card in an assembly step. The memory card in which the flash EEPROM is built, is usually examined when shipped from the factory. In the examination before the shipping of the memory card, erasing of data and writing of a test data pattern are carried out on its built-in flash EEPROM. The erasing of data and the writing of a test data pattern are carried out for the purpose of checking the state of assembly, such as contact error or the like, and the state of operation of the control circuit in the card.

However, in the examination before the shipping of the memory card, the initial defect data recorded on the flash EEPROM is destroyed while erasing the data or writing the test data pattern. Consequently, the initial defect data which has been recorded cannot be utilized for the examination.

Figure 1A:
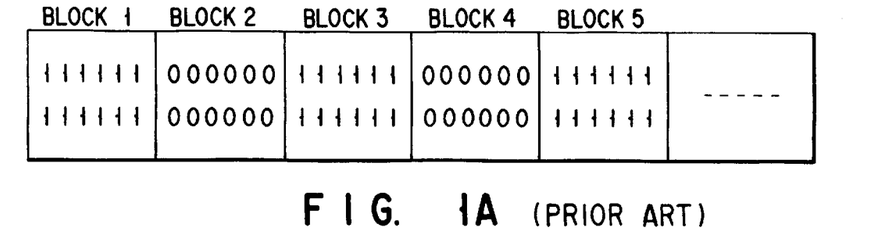
FIGS. 1A and 1B are diagrams showing the state in which initial defect data prerecorded on the flash EEPROM of a conventional IC memory card is being destroyed during the test.
Figure 1B:
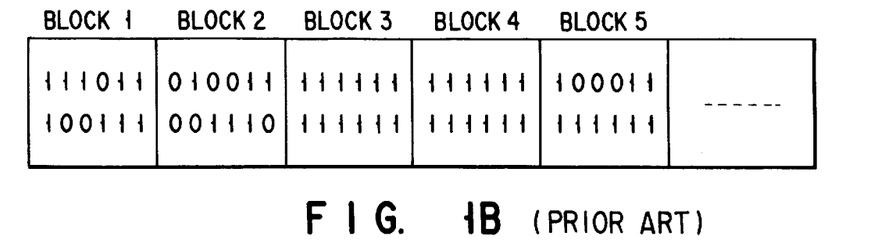

FIGS. 1A and 1B illustrate the initial defect data being destroyed as a test data pattern is written.

As shown in FIG. 1A, data "0" is already marked in a defective block of a flash EEPROM, whereas data "1" is marked in a normal block as initial defect data. In this figure, blocks 2 and 4 are defective. In the examination, when a predetermined test data pattern is written in each block on a flash EEPROM, the initial defect data is destroyed as shown in FIG. 1B, making it impossible to determine which block is defective.

In order to solve the above problem, a technique in which the initial defect data is transferred to a recording medium other than the memory card, is considered. However, with this technique, a new recording medium for reserving the initial defect data during the examination must be prepared, making the procedure complex. Further, in the case where the initial defect data is stored in a predetermined memory area on the flash EEPROM, the block in which the initial error data is stored, cannot be examined.

As described, conventionally, the initial defect data for a block prerecorded on the flash EEPROM built in a memory card cannot be effectively utilized for the examination of the block.

The memory card containing a flash EEPROM is presently being standardized in terms of physical and electrical specifications as described above; however there is no established norm regarding the specification of the formatting of the card, especially, the handling of a defective block with which writing or erasing cannot be properly carried out with respect to the flash EEPROM. As a result, it is conventionally rare to perform formatting while considering a possibility of the presence of a defective block, so that the defective block to which write/erase cannot be performed, will not have to be accessed later.

One solution to the above problem is proposed in U.S. Pat. No. 5,200,959, a method in which defective blocks on a memory (flash EEPROM or the like) are detected while formatting, and the data of the detected error block (address and type of error) are listed and stored in a predetermined memory area on the same memory. According to this method, the list of the defective block data stored in the memory area is referred to when the memory is accessed.

In the case where a new defective block is detected while writing data in the memory, the list of the defective block data is stored in the same memory but in a different memory area. When the data written in the memory is read out, the above two types of lists are referred to. Therefore, the data written in predetermined addresses are correctly read out without accessing to the defective block.

However, in this method, a large memory area is required to save the list of the defective block data and the address data, and therefore the memory area freely used by the user is limited by the list. Furthermore, in the case where a block for storing the data of defective block data is judged to be defective, some countermeasure must be taken, such as transferring the data of the error block to another memory area. In the case where all the bits on the memory are examined, the list of the data thereof must be temporarily transferred to another memory medium.

As described, with the conventional IC memory card, the formatting in consideration of the presence of defective blocks on the contained flash EEPROM, cannot be efficiently carried out.

SUMMARY OF THE INVENTION

An object of the present invention is to provide a memory card in which initial defect data of a block, prerecorded in a flash memory contained in the card, can be effectively used for the examination of the card.

Another object of the present invention is to provide a memory card with which the formatting of the card, in consideration of a defect block which may be present on a flash EEPROM contained in the card, can be efficiently carried out.

According to the first aspect of the present invention, there is provided a method of checking a memory card including a flash memory card in which a marking is provided on a defective memory block, and an attribute memory for storing card attribute data, the method comprising the steps of: storing defective block data indicating a defective memory block in a blank area of the attribute memory, based on the marking provided on the flash memory; performing check of erasing and writing with regard to a memory block in the flash memory; and updating the defective block data stored in the blank area of the attribute memory, by adding data of a defective block judged to be defective newly by the check.

With the above-described structure, the initial defect data of a block, prerecorded in the built-in flash memory, can be effectively utilized for the check.

According to the second aspect of the present invention, there is provided a method of formatting a memory card including a flash memory card in which a marking is provided on a defective memory block, and an attribute memory for storing card attribute data, the method comprising the steps of: storing defective block data indicating a defective memory block in a blank area of the attribute memory, based on the marking provided on the flash memory; performing check of erasing and writing with regard to a memory block in the flash memory; updating the defective block data stored in the blank area of the attribute memory, by adding data of a defective block judged to be defective newly by the check; writing the updated defective block data in the flash memory; and formatting the flash memory, based on the written defective block data.

With the above-described structure, the formatting in consideration of a defective block which may be present in the built-in flash memory, can be efficiently carried out.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE PREFERRED EMBODIMENTS

An embodiment of the present invention will now be described with reference to accompanying drawings.

Figure 2:
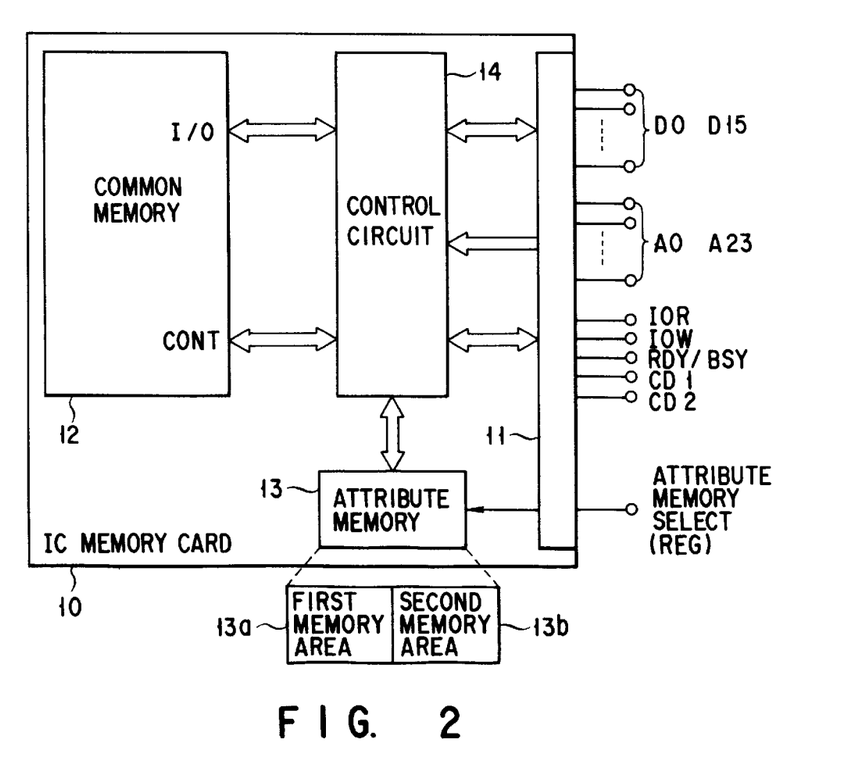
FIG. 2 is a block diagram showing the structure of an IC memory card according to an embodiment of the present invention.

FIG. 2 shows the structure of an IC memory card according to an embodiment of the present invention.

An IC memory card 10 is used as an external memory device of, for example, a personal computer, and it can be removably set into the card slot of the personal computer.

An memory card 10 has a card insertion end (portion inserted into the card slot when mounting), on which a connector 11 for connecting the card to a personal computer, is provided. In the connector 11, 68 pins which are in conformity with the standard of, for example, PCMCIA, and connectable to a connector provided in the card slot of the computer, are provided. The connector 11 has a electrode structure of a receptor-type, and is connected to the connector of a plug-type, provided in the card slot.

As shown in the figure, types of the pins provided for the connector 11 are data input/output pins (D0–D15), address input pins (A0–A23), ready/busy signal output pins (RDY/BSY), an input/output read signal pin (IOR), an input/output write signal input pin (IOW), card detection signal output pins (CD1, CD2) and an attribute memory select signal input pin (REG). These pins serve to transmit various types of signals between the IC memory card 10 and the personal computer to which the card is connected.

The connector 11 is formed to be connectable also to an examination system (not shown) used for examining the IC memory card 10 before shipping from the factory.

Furthermore, the IC memory card 10 includes a common memory 12, an attribute memory 13 and a control circuit 14.

The common memory is a semiconductor memory for storing user data and the like, supplied from the personal computer, and it consists of a plurality of flash EEPROMs.

For each of the flash EEPROMs forming the common memory 12, the minimum unit of the amount of data which can be handled at one time when erasing, writing or reading. For example, in the case of a 16 M-bit NAND-type flash EEPROM, data is erased in a unit of 4K bytes, and data is written or read in a unit of 256 bytes (1 page).

A block on each flash EEPROM, which has been judged to be defective in the test conducted at production of the flash EEPROM, stores initial defective data, which will be explained later. The initial defect data indicates a defective block which cannot be used properly for erasing or writing, of the plurality of blocks on the flash EEPROMs which constitute the common memory 12.

An input/output terminal (I/O) and a control signal terminal (CONT) of the common memory 12 are connected to the control circuit 14.

The attribute memory 13 is a non-volatile memory consisting of EEPROMs and the like, and is made of a first memory area 13a and a second memory area 13b.

The first memory area 13a is a memory area reserved by using a blank area initially present in the attribute memory 13, so as to achieve the present invention. The first memory area 13a is used to hold the initial defect data recorded on a flash EEPROM contained in the common memory 12, and also to hold the data of a defective block newly found in the examination conducted at the time of shipment.

As will be described later, the data of the defective block saved in the first memory area 13a, is formed based on the initial defect data recorded in the flash EEPROM contained in the common memory 12. Thus formed defective block data is updated when a newer defect data is found in the examination at shipment.

The second memory area 13b is called tupple, and it is an area for storing card attribute data.

The card attribute data contained in the second memory area 13b includes data indicating the type of memory of the common memory 12, the memory size, the accessing speed and the like, and data (tupple cord) indicating the usage of the IC memory card 10 (e.g. whether the card is used as a disk or memory).

In the second memory area 13b, the data relating to the defective block, used for achieving the present invention, can be stored as one of the card attribute data. The defect block relating data, as will be described later, is formed at a predetermined address in the second memory region 13b on the basis of the updated error block data to be stored in the first memory area 13a.

The contents of the second memory area 13b can be freely read by the user through the personal computer connected to the IC memory card 10.

The control circuit 14 controls signals transmitted among the common memory 12 in the IC memory card 10, the attribute memory 13, the personal computer connected via the connector 11 and the like.

Figure 3A:
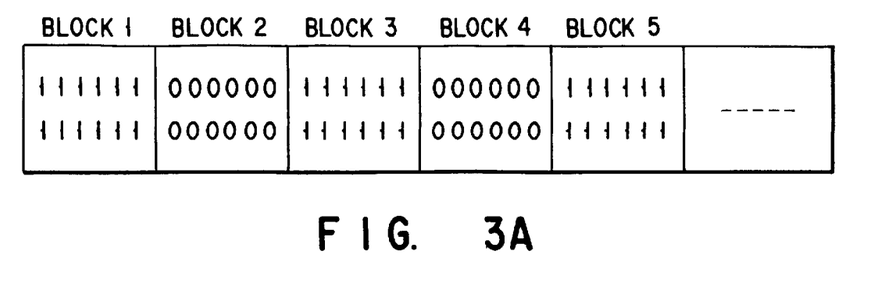
FIGS. 3A and 3B are diagrams showing the state in which defect block data is being recorded on an attribute memory based on the initial defect data prerecorded on the flash EEPROM constituting a common memory shown in FIG. 2.

FIG. 3A illustrates the state in which initial defect data is stored on the flash EEPROMs constituting the common memory 12.

As described, a marking has been carried out on a defective block on the flash EEPROMs constituting the common memory 12, already at the production of the flash EEPROM. In the marking, data "0" is written in all the bits within a block when at least one defective bit is present in the block. In the case where there is not defective bit in a block, data "1" is written in all the bits of the block.

For example, as shown in FIG. 3A, in the case where block 2 and block 4 are defective, data "0" is written in each of the bits within the block 2 and block 4. In contrast, data "1" is written in each of the bits within the normal blocks, i.e. block 1, block 3, block 5 . . .

Figure 3B:
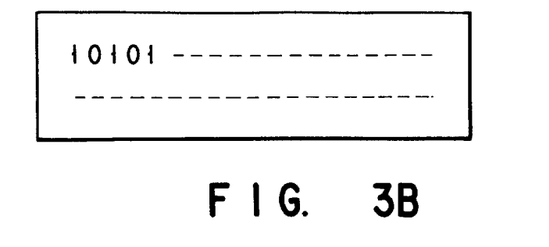

In this case, data column "1010111 . . . " is stored as defective block data in the first memory area 13a of the attribute memory 13 as shown in FIG. 3B. This data column "1010111 . . . " is formed by putting "0" for a defective block in FIG. 3A, and "1" for a normal block in the order of the block number (block address). Therefore, the defective block data shown in FIG. 3B and the initial defective data shown in FIG. 3A represent substantially the same content. It is also considered that the initial defect data shown in FIG. 3A is stored in the first memory area 13a in a different form. It should be noted that the defective block data shown in FIG. 3B is updated at the examination of shipment, as will be described later.

The defective block relating data stored in the second memory area (tupple) 13b will now be described in detail with reference to FIG. 4.

As described, an area for storing defective block relating data, which is one of card attribute data, is reserved in the second memory area (tupple) 13b. The defective block related data is formed at a predetermined address in the second memory region 13b after the defective block data on the first memory area 13a is updated, based on the updated defective block data.

Figure 4:
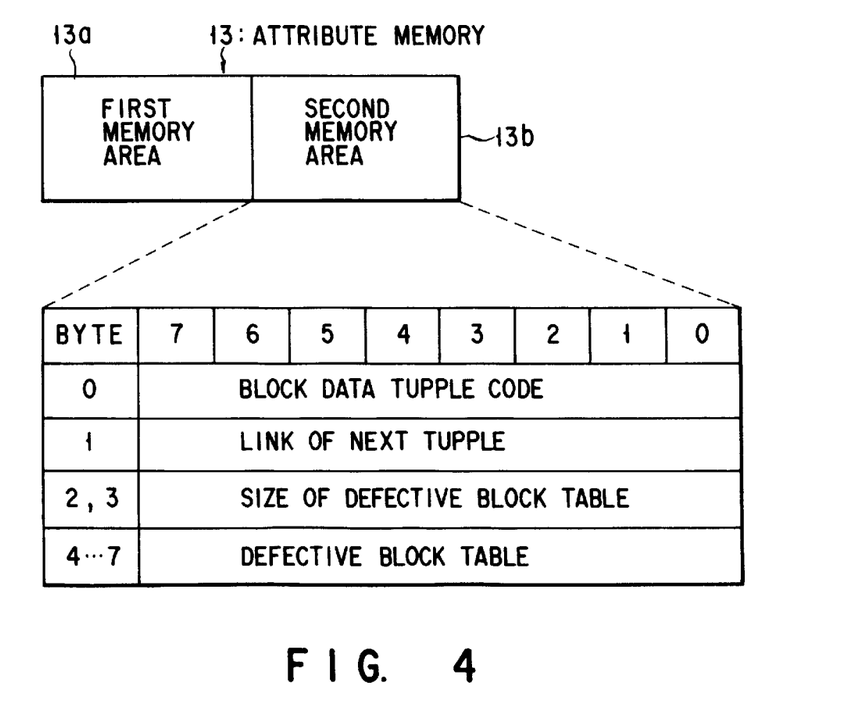
FIG. 4 is a diagram showing types of data stored in the memory area of the attribute memory shown in FIG. 2.

For example, as shown in FIG. 4, in a predetermined region of the second memory area 13b, a block data tupple code (byte 0), a link (link 1) of the next tupple, a size (bytes 2 and 3) of a defective block table and a defective block table (bytes 4 to 7).

The defective block table includes a plurality of defective block table entries 0–511 designed to store the address of a defective block. Each entry is designed to store (register) the address of one defective block.

Figure 5:
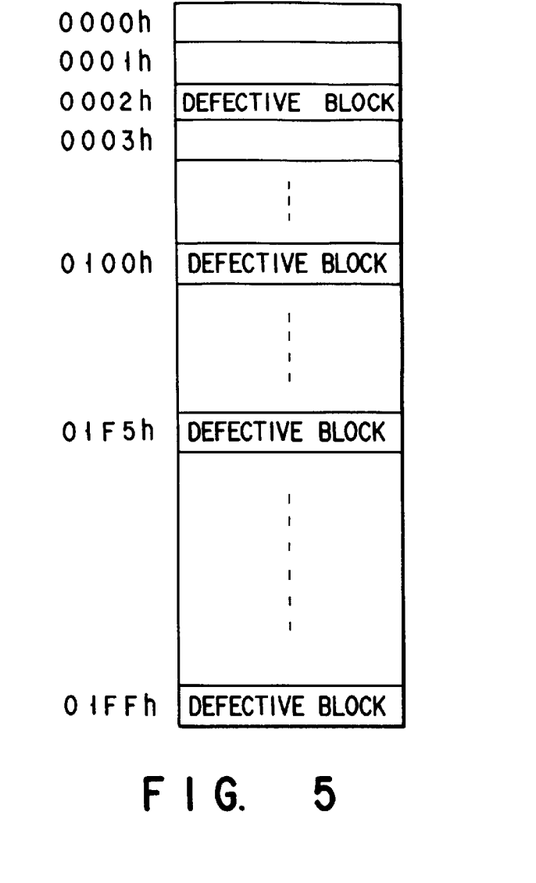
FIG. 5 is a diagram showing a defect block on the flash EEPROM constituting a common memory, shown in FIG. 2.
Figure 6:
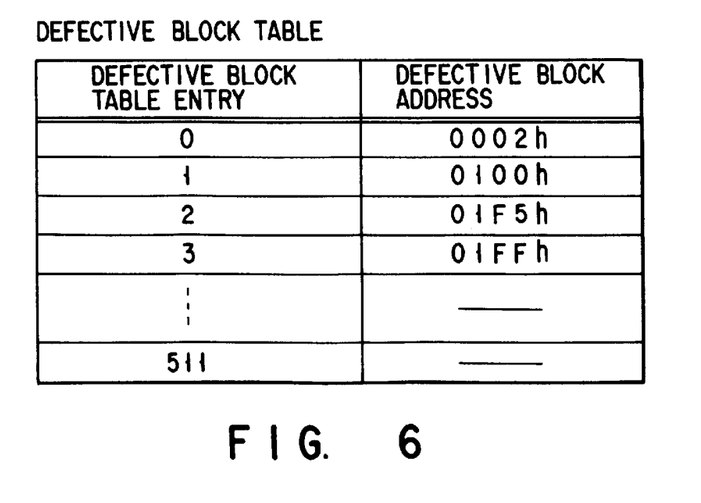
FIG. 6 is a diagram showing the state in which a defect block address is recorded on an entry of the defect block table shown in FIG. 4.

Let us now suppose that, for example, of blocks corresponding to addresses 000h to 1FFh, four blocks indicated by shade as shown in FIG. 5 are defective on the common memory 12. That is, the block addresses corresponding to these defective blocks are "0002h", "0100h", "01F5h" and "01FFh". In this case, the addresses of the defective blocks, namely, "0002h", "0100h", "01F5h" and "01FFh" are registered in the defective block table entries 0 to 3 in the formed defective block table in the order, as shown in FIG. 6.

Figure 7:
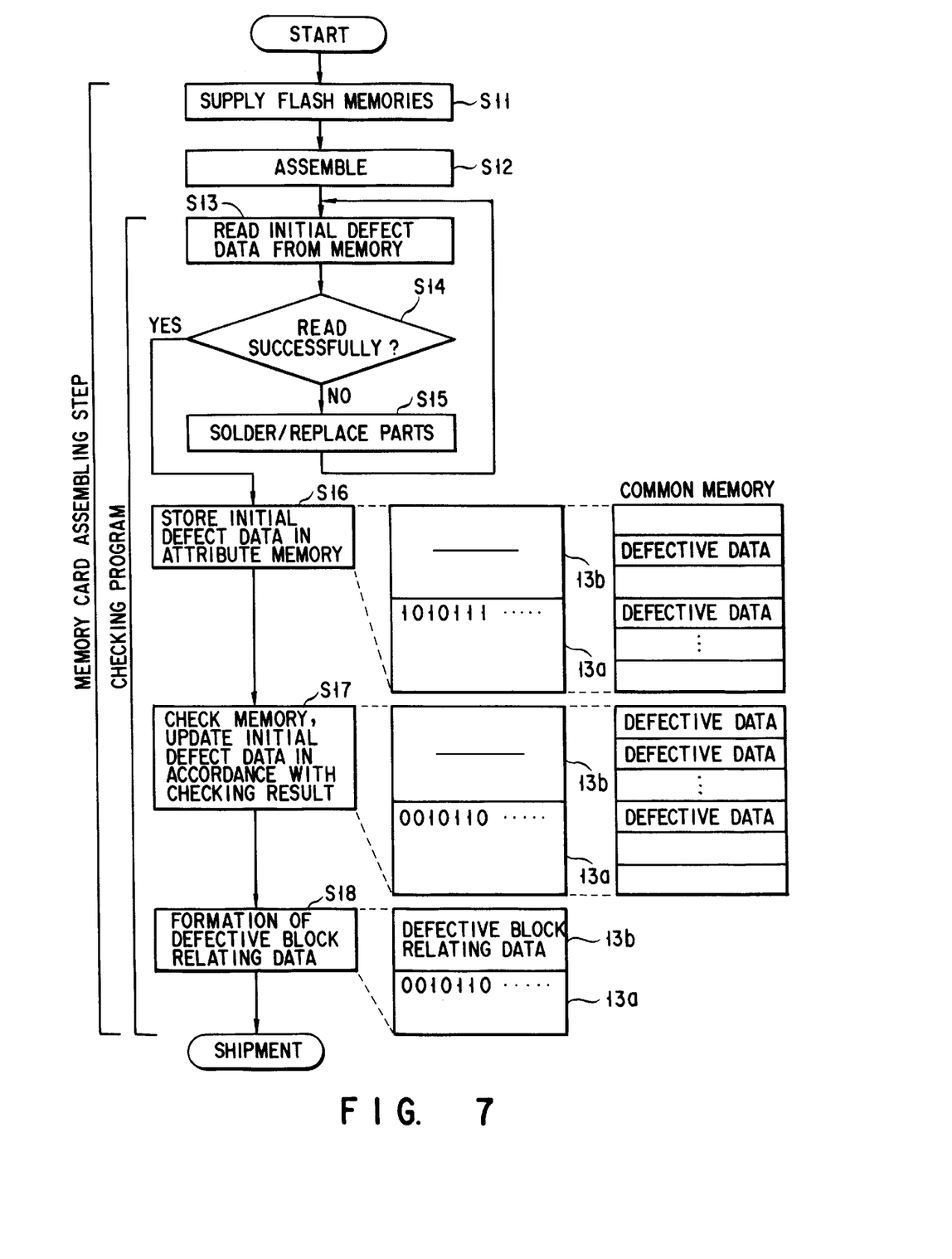
FIG. 7 illustrates a procedure of assembling and examining the IC memory card shown in FIG. 2.

The procedure of formation of the IC memory card 10 will now be described with reference to FIGS. 7 and 8.

First, a plurality of flash EEPROMs are supplied (step Sll). Each defective block of the flash EEPROMs is already marked with data "0" and "1" which are the initial defective data.

Next, the plurality of flash EEPROMs supplied are mounted on the substrate of the IC memory card 10, which is called an assembly operation (step S12). At the same time, the common memory 12 is made of the plurality of flash EEPROMs.

After completion of the assembly operation of the IC memory card 10, the IC memory card 10 is connected to a checking system (not shown) via the connector 11, thus the card is checked by the examination program equipped in the examination system. In this check, the flash EEPROM constituting the common memory 12 is first read-accessed, and the initial defective data is read out into the checking system from each block (step S13).

Next, it is judged as to whether or not read-out of the initial defect data has been successful (step S14). In the case where the read-out of the initial defect data has been unsuccessful, it is judged that the element error of the flash EEPROM or the contact error of the assembly occur, and the soldering of parts is repeated or flash EEPROM chips are replaced (step S15). Then, the checking is repeated, starting again from step S13.

In the case where the read-out of the initial defect data has been successful, defective block data is formed based on the initial defect data, and the defective block data is stored in the first memory area 13a of the attribute memory 13 (step S16). More specifically, in the first memory region 13a of the attribute memory 13, data column "1010111 . . . " as shown in FIG. 3B is saved as defective block data. The data column of this case exhibits that the second and fourth blocks (which correspond to address 0001h and address 0003h in FIG. 5) are defective.

The check program is used to check a defective block present on a flash EEPROM. In the case where a new defective block is found, the defective block data to be stored in the first memory area 13a is updated by the check program (step S17).

The step S17 will now be described in detail.

In this check, first, the contents of all the blocks on a flash EEPROM are erased, and a test data pattern is written in each block. Next, data is read out from each block, and thus it is checked whether or not a test data pattern is reproduced as it has been written. In other words, the confirmation of coincidence/not-coincidence between a written test data pattern and a read test data pattern is carried out bit by bit, and a block containing a bit confirmed to be not coincident, is judged to be defective.

For example, it is confirmed that the first and seventh blocks, which were not judged to be defective in the test carried out at production of the flash EEPROM, are defective in the check, the data column stored in the first memory area 13a is rewritten from "1010111 . . . " to "0010110 . . . ".

The reliability of the defective block data initially recorded in the first memory area 13a, since the new defective block data as a test result has been added thereto, is further raised. In other words, the initial defect data initially recorded on the flash EEPROM is effectively used in the check. Therefore, in the step S17, the result of the check, in which the initial defect data is effectively used, is maintained in the IC memory card.

After that, the updated defective block data may be stored as an initial defect data in the common memory 12.

Next, the defective block relating data including the defective block data is formed, and this data is stored in the second memory area 13b of the attribute memory 13 together with the other card attribute data (step S18). In this case, the checking program guides out the address of the defective block based on the data column of the first memory area 13a, and registers the guided address on the defective block table.

After that, the defective block relating data is recorded in an ordinary form (e.g., a form based on the PC Card Standards) on the common memory 12.

Then, the IC memory card 10 is ready to be shipped, and it is used as being inserted into the personal computer or the like by the user.

Figure 8:
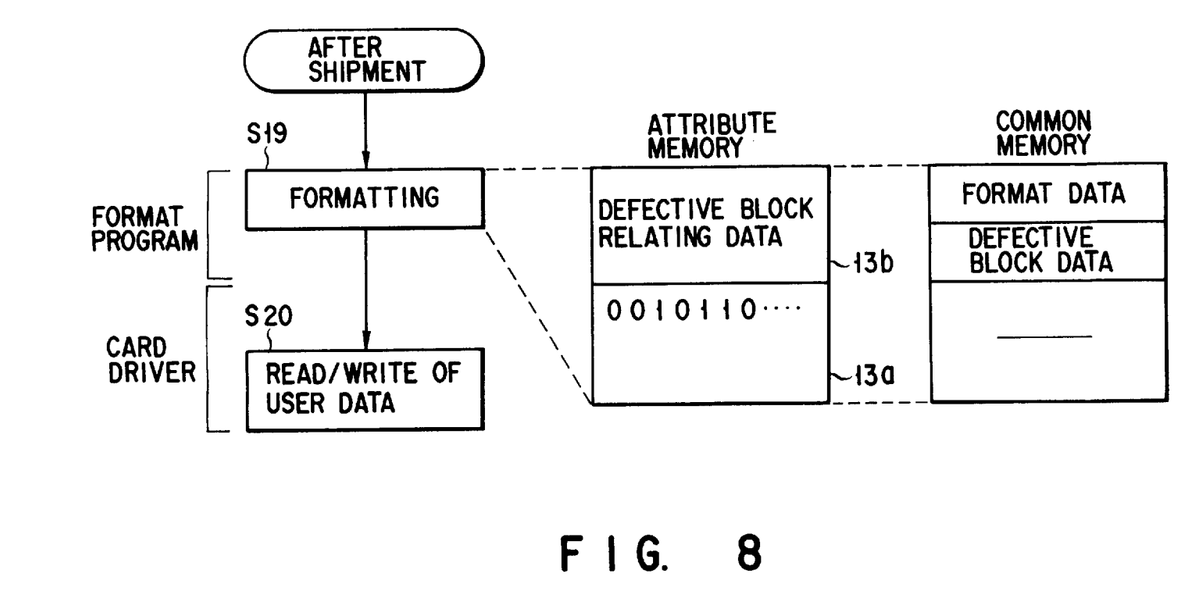
FIG. 8 illustrates a procedure of formatting, and reading/writing of user data, carried out after the IC memory card shown in FIG. 2, is shipped from the factory.

After the shipment of the IC memory card 10, as shown in FIG. 8, the IC memory card 10 is formatted by the format program provided in the personal computer (step S19). In this formatting, the format data according to the ordinary flash format is recorded on the common memory 12 on the basis of the defective block data on the same common memory 12. In this case, the recording form is based on the PC Card Standards 1995, for example.

In this manner, the format data and defective block data are written on a flash EEPROM.

After that, under the control of the card driver, the user data is written in or read from the IC memory card 10, and a management of the defective block is carried out (step S20).

In this case, the card driver controls to avoid accessing the defective blocks by referring to the defective block data on the common memory 12 while reading user data. Similarly, the card driver controls to avoid the defective blocks by referring to the defective block data while writing user data.

In the above management, for example, the defective block data is reproduced on the common memory 12 on the basis of the defective block relating data stored in the attribute memory 13 in the case where the defective block data is destroyed by a bag or malfunction, and the defective block data and the defective block relating data is updated in the case where another defective data is newly found on the common memory 12 while using the memory card.

As described above, according to the present invention, the initial defect data on a flash EEPROM is stored in a blank region of the attribute memory, and therefore the initial defective data is never lost in the check carried out by erasing data from a block, writing a test data pattern and the like. Further, it is not necessary to prepare a recording medium exclusively for storing initial defect data. The data of the defective block newly found by the check is added to the initial defect data stored in a blank region of the attribute memory, and therefore highly-reliable defective block data can be saved in the IC memory. Further, in the case where a number of cards are checked at once, it is not necessary to categorize or maintain initial defect data card by card, thus making it possible to simplifying the checking step.

Furthermore, according to the present invention, data such as the address of a defective block is stored in a tupple of the attribute memory, and therefore the block data on the common memory can be reproduced even if the block data is destroyed.

Additionally, since the defective block data stored in the common memory has high reliability, the formatting can be effectively performed such that a fewer number of defective blocks are found on the common memory after formatting. Therefore, the load on the card driver and the like can be reduced while reading/writing user data.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

The above embodiment was described in connection with the case where the first memory area and second memory area are used; however it is possible to constitute the IC memory card with omitting one of the first memory area and second memory area.

The above embodiment was described in connection with the case where flash EEPROMs are provided in the IC memory card; however the present invention can be applied to any type of IC memory cards as long as readable/writable memories are provided therein.

As described above in detail, according to the present invention, the check of an IC card, in which the initial defect data is utilized, can be effectively carried out without destroying the initial defect data. Also, formatting which takes a defective block present on a built-in flash memory into consideration, can be carried out at high efficiency. Consequently, the problem in which a block incapable of erasing/writing appears after formatting, does not occur.

What is claimed is:

1. A memory card comprising:

a flash memory;

an attribute memory, physically separate from said flash memory, for storing attribute data of said memory card; and a controller coupled to said flash memory and said attribute memory and including means for copying defective block data, which represents addresses of defective blocks of said flash memory and includes initial defective block data initially recorded on said flash memory, onto a blank area of said attribute memory.

2. The memory card according to claim 1, wherein said defective block data stored in said attribute memory includes secondary defective block data representing addresses of defective blocks which have been discovered by checking said flash memory for defective blocks not included in the initial defective block data.

3. The memory card according to claim 1, wherein said defective block data in the blank area of said attribute memory is written in a form of codes.

4. The memory card according to claim 1, wherein said defective block data including the initial and secondary defective block data stored in said attribute memory is recorded onto said flash memory.

5. The memory card according to claim 1, wherein said controller includes means for reading the initial defective block data from said flash memory and storing the initial defective block data as said defective block data onto the blank area of said attribute memory.

6. The memory card according to claim 5, wherein said controller includes means for updating said defective block data stored in said attribute memory by adding secondary defective block data representing addresses of defective blocks which have been discovered by checking said flash memory for defective blocks not included in the initial defective block data.

7. The memory card according to claim 6, wherein said controller includes means for recording said defective block data stored in said attribute memory onto said flash memory.

8. The memory card according to claim 1, wherein said memory card has a specification based on a standard set by PCMCIA (Personal Computer Memory Card International Association).

9. A method of utilizing initial defective block data initially recorded on a flash memory in a memory card, comprising the steps of:

storing attribute data in an attribute memory of said memory card, said attribute memory being physically separate from said flash memory;

reading the initial defective block data from said flash memory; and storing the initial defective block data as defective block data onto a blank area of said attribute memory.

10. The method according to claim 9, further comprising the step of updating the defective block data stored in said attribute memory by adding secondary defective block data representing addresses of defective blocks which have been discovered by checking said flash memory for defective blocks not included in the initial defective block data.

11. The method according to claim 10, further comprising the step of recording the defective block data including the initial and secondary defective block data stored in said attribute memory onto said flash memory.

* * * * *

UNITED STATES PATENT AND TRADEMARK OFFICE
CERTIFICATE OF CORRECTION

PATENT NO. :
DATED :     5,864,661
INVENTOR(S) : January 26, 1999
            Ohara It is certified that error appears in the above-identified patent and that said Letters Patent is hereby corrected as shown below:

Claim 3, column 9, line 29, "claim 1" should read --claim 2--.

Claim 4, column 9, line 32, "claim 1" should read --claim 2--.

Claim 5, column 9, line 36, "claim 1" should read --claim 2--.

Signed and Sealed this

Twenty-third Day of November, 1999

Attest:

Q. TODD DICKINSON

*Attesting Officer*     *Acting Commissioner of Patents and Trademarks*